(12) United States Patent
Olarig

(10) Patent No.: US 11,741,040 B2
(45) Date of Patent: *Aug. 29, 2023

(54) SFF-TA-100X BASED MULTI-MODE PROTOCOLS SOLID STATE DEVICES

(71) Applicant: Samsung Electronics Co., Ltd., Suwon-si (KR)

(72) Inventor: Sompong Paul Olarig, Pleasanton, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/589,514

(22) Filed: Jan. 31, 2022

(65) Prior Publication Data

US 2022/0188002 A1 Jun. 16, 2022

Related U.S. Application Data

(63) Continuation of application No. 16/509,342, filed on Jul. 11, 2019, now Pat. No. 11,238,005.

(60) Provisional application No. 62/701,494, filed on Jul. 20, 2018.

(51) Int. Cl.
*G06F 13/42* (2006.01)
*G06F 13/40* (2006.01)
*G06F 30/34* (2020.01)
*G06F 3/06* (2006.01)

(52) U.S. Cl.
CPC ........ *G06F 13/4282* (2013.01); *G06F 3/0604* (2013.01); *G06F 3/0634* (2013.01); *G06F 3/0659* (2013.01); *G06F 3/0683* (2013.01); *G06F 13/4022* (2013.01);

(Continued)

(58) Field of Classification Search
CPC .. G06F 13/4282; G06F 30/34; G06F 13/4022; G06F 2213/0026; G06F 2213/0036; G06F 13/1684; G06F 3/0661; G06F 3/0634; G06F 3/0658; G06F 3/0683; G06F 13/387; G06F 13/4221
USPC ................ 710/2, 11, 14, 62, 104, 105, 313; 370/465
See application file for complete search history.

(56) References Cited

U.S. PATENT DOCUMENTS 8,972,627 B2   3/2015   Strasser et al.
9,171,643 B2  10/2015   Lee et al.
9,263,102 B2   2/2016   Flynn et al.
(Continued)

FOREIGN PATENT DOCUMENTS

WO   WO 2013/176303 A1   11/2013

OTHER PUBLICATIONS

"SFF-TA-1009 Specification for Enterprise and Datacenter SSD Pin and Signal Specification" (Rev 2.0). SNIA. Mar. 22, 2018. (Year: 2018).

(Continued)

*Primary Examiner* — Idriss N Alrobaye
*Assistant Examiner* — Henry W Yu
(74) *Attorney, Agent, or Firm* — Lewis Roca Rothgerber Christie LLP

(57) ABSTRACT

A system includes a storage device; a storage device controller; a first interface configured to connect the storage device controller to the storage device; and a second interface configured to connect the storage device controller to a host device, wherein the storage device is configured to operate in a first mode or a second mode based on a status of a signal at the second interface based on instructions received from the host device.

20 Claims, 5 Drawing Sheets

(52) U.S. Cl.
  CPC ...... *G06F 30/34* (2020.01); *G06F 2213/0026* (2013.01); *G06F 2213/0036* (2013.01)

(56) References Cited

U.S. PATENT DOCUMENTS

| | | |
|---|---|---|
| 9,519,594 B2 | 12/2016 | Flynn et al. |
| 9,965,356 B2 | 5/2018 | Li |
| 10,141,050 B1 | 11/2018 | Kannan et al. |
| 10,264,701 B1 | 4/2019 | Norton |
| 2005/0251609 A1 | 11/2005 | Chou et al. |
| 2008/0071963 A1 | 3/2008 | Chow et al. |
| 2012/0233374 A1 | 9/2012 | Whitefield et al. |
| 2014/0164170 A1 | 6/2014 | Li et al. |
| 2015/0254003 A1 | 9/2015 | Lee et al. |
| 2015/0261714 A1 | 9/2015 | Talmola |
| 2017/0168943 A1 | 6/2017 | Chou et al. |
| 2018/0165396 A1 | 6/2018 | Lin et al. |
| 2018/0188974 A1 | 7/2018 | Cayton et al. |
| 2018/0246833 A1 | 8/2018 | Bai et al. |
| 2019/0005176 A1 | 1/2019 | Illikkal et al. |
| 2019/0238412 A1 | 8/2019 | Vohra et al. |

OTHER PUBLICATIONS

"SFF-TA-1008 Specification for Enterprise and Datacenter SSD 3 Form Factor" (Revision 1.0). SN IA. Mar. 30, 2018 (Year: 2018).

12 # SFF-TA-100X BASED MULTI-MODE PROTOCOLS SOLID STATE DEVICES

CROSS-REFERENCE TO RELATED APPLICATION(S)

This application is a continuation of U.S. patent application Ser. No. 16/509,342, filed Jul. 11, 2019, which claims priority to and the benefit of U.S. Provisional Patent Application Ser. No. 62/701,494, filed Jul. 20, 2018 and entitled "SFF-TA-100X BASED MULTI-MODE PROTOCOLS FPGA+SOLID STATE DEVICES," the entire contents of both which are incorporated herein by reference.

FIELD

One or more aspects of embodiments according to the present disclosure relate to a (SFF)-technology affiliate (TA)-100X based multi-mode protocols solid state devices.

BACKGROUND

Non-volatile memory (NVM) express (NVMe) is a standard that defines a register-level interface for host software to communicate with a non-volatile memory subsystem (e.g., a solid state drive (SSD)) over a Peripheral Component Interconnect Express (PCIe) bus. NVMe is an alternative to the Small Computer System Interface (SCSI) standard for connecting and transferring data between a host and a peripheral target storage device or system. PCIe-connected NVMe SSDs allow applications to communicate directly to storage.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of some example embodiments of the present disclosure relate to a SFF-TA-100X based multi-mode protocols solid state devices.

In some embodiments, a system includes a storage device; a storage device controller; a first interface configured to connect the storage device controller to the storage device; and a second interface configured to connect the storage device controller to a host device, wherein the storage device is configured to operate in a first mode or a second mode based on a status of a signal at the second interface based on instructions received from the host device.

In some embodiments, the storage device is one of a new form factor 1 (NF1) solid state drive (SSD), an Ethernet SSD (eSSD), or an embedded SSD, and the storage device controller is a field programmable gate array (FPGA) or an application specific integrated circuit (ASIC). In some embodiments, the first interface is a peripheral component interconnect express (PCIe) interface or a U.2 connector, and the second interface is a small form factor (SFF)-technology affiliate (TA)-100X connector, where X is one of 2, 6, 7, 8, or 9, wherein the storage device has one of SFF-8201 2.5" drive form factor dimensions; SFF-8223 2.5" drive form factor with serial connector; SFF-8301 3.5" drive form factor dimensions; or SFF-8323 3.5" drive form dactor with serial connector.

In some embodiments, the first mode and the second mode of operation of the storage device are a non-volatile memory express (NVMe) mode and an NVMe over fabrics (NVMe-oF) mode, respectively. In some embodiments, the second interface is a (SFF)-technology affiliate (TA)-1008 connector and the status of the signal at the second interface is the status of the signal at a reserved for future use (RFU) pin of the SFF-TA-1008 connector, wherein the storage device operates in the NVMe mode when the status of the signal at the RFU pin of the SFF-TA-1008 connector is high and the storage device operates in the NVMe-oF mode when the status of the signal at the RFU pin of the SFF-TA-1008 connector is low, wherein in each of the NVMe mode and the NVMe-oF mode, the SFF-TA-1008 connector operates in X4 single port, X4 dual port, X8 single port, X8 dual port, X16 single port, and X16 dual port mode.

In some embodiments, PCIe signals PERp2, PERn2, PETp2, and PETn2, of the SFF-TA-1008 connector, are configured as control host A and Ethernet port 0, and PCIe signals PERp3, PERn3, PETp3, and PETn3, of the SFF-TA-1008 connector, are configured as control host A and Ethernet port 1, when the storage device and the SFF-TA-1008 connector operate in the NVMe-oF mode and X4 single port mode, respectively. In some embodiments, PCIe signals PERp1, PERn1, PETp1, and PETn1, of the SFF-TA-1008 connector, are configured as host A and Ethernet port 0, and PCIe signals PERp3, PERn3, PETp3, and PETn3, of the SFF-TA-1008 connector, are configured as host B and Ethernet port 1, when the storage device and the SFF-TA-1008 connector operate in the NVMe-oF and X4 dual port mode, respectively. In some embodiments, PCIe signals PERp4, PERn4, PETp4, and PETn4, of the SFF-TA-1008 connector, are configured as host A and Ethernet port 0, PCIe signals PERp5, PERn5, PETp5, and PETn5 of the SFF-TA-1008 connector are configured as host A and Ethernet port 1, PCIe signals PERp6, PERn6, PETp6, and PETn6, of the SFF-TA-1008 connector, are configured as host A and Ethernet port 2, and PCIe signals PERp7, PERn7, PETp7, and PETn7, of the SFF-TA-1008 connector, are configured as host A and Ethernet port 3, when the storage device and the SFF-TA-1008 connector operate in the NVMe-oF and X8 single port mode, respectively.

In some embodiments, PCIe signals PERp2, PERn2, PETp2, and PETn2, of the SFF-TA-1008 connector, are configured as host A and Ethernet port 0, PCIe signals PERp3, PERn3, PETp3, and PETn3, of the SFF-TA-1008 connector, are configured as host A and Ethernet port 1, PCIe signals PERp6, PERn6, PETp6, and PETn6, of the SFF-TA-1008 connector, are configured as host B and Ethernet port 2, and PCIe signals PERp7, PERn7, PETp7, and PETn7, of the SFF-TA-1008 connector, are configured as host B and Ethernet port 3, when the storage device and the SFF-TA-1008 connector operate in the NVMe-oF and X8 single port mode, respectively.

In some embodiments, PCIe signals PERp8, PERn8, PETp8, and PETn8, of the SFF-TA-1008 connector are configured as host A and Ethernet port 0, PCIe signals PERp9, PERn9, PETp9, and PETn9 of the SFF-TA-1008 connector are configured as host A and Ethernet port 1, PCIe signals PERp10, PERn10, PETp10, and PETn10, of the SFF-TA-1008 connector, are configured as host A and Ethernet port 2, PCIe signals PERp11, PERn11, PETp11, and PETn11 of the SFF-TA-1008 connector are configured as host A and Ethernet port 3, PCIe signals PERp12, PERn12, PETp12, and PETn12 of the SFF-TA-1008 connector are configured as host A and Ethernet port 4, PCIe signals PERp13, PERn13, PETp13, and PETn13 of the SFF-TA-1008 connector are configured as host A and Ethernet port 5, PCIe signals PERp14, PERn14, PETp14, and PETn14 of the SFF-TA-1008 connector are configured as host A and Ethernet port 6, and PCIe signals PERp15, PERn15, PETp15, and PETn15 of the SFF-TA-1008 connector are configured as host A and Ethernet port 7, when the storage device and the SFF-TA-1008 connector operate in the NVMe-oF and X16 single port mode, respectively.

In some embodiments, PCIe signals PERp8, PERn8, PETp8, and PETn8, of the SFF-TA-1008 connector, are configured as host A and Ethernet port 0, PCIe signals PERp9, PERn9, PETp9, and PETn9, of the SFF-TA-1008 connector, are configured as host A and Ethernet port 1, PCIe signals PERp10, PERn10, PETp10, and PETn10, of the SFF-TA-1008 connector, are configured as host B and Ethernet port 0, PCIe signals PERp11, PERn11, PETp11, and PETn11, of the SFF-TA-1008 connector, are configured as host B and Ethernet port 1, PCIe signals PERp12, PERn12, PETp12, and PETn12, of the SFF-TA-1008 connector, are configured as host A and Ethernet port 2, PCIe signals PERp13, PERn13, PETp13, and PETn13, of the SFF-TA-1008 connector, are configured as host A and Ethernet port 3, PCIe signals PERp14, PERn14, PETp14, and PETn14, of the SFF-TA-1008 connector, are configured as host B and Ethernet port 2, and the PCIe signals PERp15, PERn15, PETp15, and PETn15, of the SFF-TA-1008 connector, are configured as host B and Ethernet port 3, when the storage device and the SFF-TA-1008 connector operate in the NVMe-oF and X16 dual port mode, respectively.

In some embodiments, a system includes a computing device; and a storage device connected to the computing device via a first interface, wherein the computing device is configured to operate as a controller of the storage device, and wherein the computing device is connected to a host device via a second interface.

In some embodiments, the storage device is one of a new form factor 1 (NF1) solid state drive (SSD), an Ethernet SSD (eSSD), or an embedded SSD, and the computing device is a field programmable gate array (FPGA) or an application specific integrated circuit (ASIC), the first interface is a peripheral component interconnect express (PCIe) interface or a U.2 connector, and the second interface is a small form factor (SFF)-technology affiliate (TA)-1008 connector, the storage device is configured to operate in a non-volatile memory express (NVMe) mode or an NVMe over fabrics (NVMe-oF) mode, based on a status of a signal at a reserved for future use (RFU) pin of the SFF-TA-1008 connector based on instructions received from the host device via a general purpose input output (GPIO) connecting to the RFU, and the storage device operates in the NVMe mode when the status of the signal at the RFU pin of the SFF-TA-1008 connector is high and the storage device operates in the NVMe-oF mode when the status of the signal at the RFU pin of the SFF-TA-1008 connector is low, wherein in each of the NVMe mode and the NVMe-oF mode, the SFF-TA-1008 connector operates in X4 single port, X4 dual port, X8 single port, X8 dual port, X16 single port, and X16 dual port mode.

In some embodiments, in the X4 single port mode, when the RFU pin of the SFF-TA-1008 connector transitions from low to high status, PCIe signals PERp2, PERn2, PETp2, and PETn2, of the SFF-TA-1008 connector, transition from being configured as host A, PCIe lane 2 to host A, Ethernet port 0, and PCIe signals PERp3, PERn3, PETp3, and PETn3, of the SFF-TA-1008 connector, transition from being configured as host A, PCIe lane 3 to host A, Ethernet port 1, and wherein in the X4 dual port mode, when the RFU pin of the SFF-TA-1008 connector transitions from low to high status, PCIe signals PERp1, PERn1, PETp1, and PETn1, of the SFF-TA-1008 connector, transition from being configured as host A, PCIe lane 1 to host A, Ethernet port 0, and PCIe signals PERp3, PERn3, PETp3, and PETn3, of the SFF-TA-1008 connector, transition from being configured as host B, PCIe lane 1 to host B, Ethernet port 1.

In some embodiments, in the X8 single port mode, when the RFU pin of the SFF-TA-1008 connector transitions from low to high status, PCIe signals PERp4, PERn4, PETp4, and PETn4, of the SFF-TA-1008 connector, transition from being configured as host A, PCIe lane 4 to host A, Ethernet port 0, PCIe signals PERp5, PERn5, PETp5, and PETn5, of the SFF-TA-1008 connector, transition from being configured as host A, PCIe lane 5 to host A, Ethernet port 1, PCIe signals PERp6, PERn6, PETp6, and PETn6, of the SFF-TA-1008 connector, transition from being configured as host A, PCIe lane 6 to host A, Ethernet port 2, and PCIe signals PERp7, PERn7, PETp7, and PETn7, of the SFF-TA-1008 connector, transition from bring configured as host A, PCIe lane 7 to host A, Ethernet port 3, and wherein in the X8 dual port mode, when the RFU pin of the SFF-TA-1008 connector transitions from low to high status, PCIe signals PERp2, PERn2, PETp2, and PETn2, of the SFF-TA-1008 connector, transition from being configured as host B, PCIe lane 0 to host A, Ethernet port 0, PCIe signals PERp3, PERn3, PETp3, and PETn3, of the SFF-TA-1008 connector, transition from being configured as host B, PCIe lane 1 to host A, Ethernet port 1, PCIe signals PERp6, PERn6, PETp6, and PETn6, of the SFF-TA-1008 connector, transition from being configured as host B, PCIe lane 2 to host B, Ethernet port 2, and PCIe signals PERp7, PERn7, PETp7, and PETn7, of the SFF-TA-1008 connector, transition from being configured as host B, lane 3 to host B, Ethernet port 3.

In some embodiments, in the X16 single port mode, when the RFU pin of the SFF-TA-1008 connector transitions from low to high status, PCIe signals PERp8, PERn8, PETp8, and PETn8, of the SFF-TA-1008 connector, transition from being configured as host A, PCIe lane 8 to host A, Ethernet port 0, PCIe signals PERp9, PERn9, PETp9, and PETn9, of the SFF-TA-1008 connector, transition from being configured as host A, PCIe lane 9 to host A, Ethernet port 1, PCIe signals PERp10, PERn10, PETp10, and PETn10, of the SFF-TA-1008 connector, transition from being configured as host A, PCIe lane 10 to host A, Ethernet port 2, PCIe signals PERp11, PERn11, PETp11, and PETn11, of the SFF-TA-1008 connector, transition from being configured as host A, PCIe lane 11 to host A, Ethernet port 3, PCIe signals PERp12, PERn12, PETp12, and PETn12, of the SFF-TA-1008 connector, transition from being configured as host A, PCIe lane 12 to host A, Ethernet port 4, PCIe signals PERp13, PERn13, PETp13, and PETn13, of the SFF-TA-1008 connector, transition from being configured as host A, PCIe lane 13 to host A, Ethernet port 5, PCIe signals PERp14, PERn14, PETp14, and PETn14, of the SFF-TA-1008 connector, transition from being configured as host A, lane 14 to host A, Ethernet port 6, and PCIe signals PERp15, PERn15, PETp15, and PETn15, of the SFF-TA-1008 connector, transition from being configured as host A, lane 15 to host A, Ethernet port 7.

In some embodiments, in the X16 dual port mode, when the RFU pin of the SFF-TA-1008 connector transitions from low to high status, PCIe signals PERp8, PERn8, PETp8, and PETn8, of the SFF-TA-1008 connector, transition from being configured as host A, PCIe lane 4 to host A, Ethernet port 0, PCIe signals PERp9, PERn9, PETp9, and PETn9, of the SFF-TA-1008 connector, transition from being configured as host A, PCIe lane 5 to host A and Ethernet port 1, PCIe signals PERp10, PERn10, PETp10, and PETn10, of the SFF-TA-1008 connector, transition from being configured as host B, PCIe lane 4 to host B, Ethernet port 0, PCIe signals PERp11, PERn11, PETp11, and PETn11, of the SFF-TA-1008 connector, transition from being configured as host B, PCIe lane 5 to host B, Ethernet port 1, PCIe signals PERp12, PERn12, PETp12, and PETn12, of the SFF-TA-1008 connector, transition from being configured as host A, PCIe lane 6 to host A, Ethernet port 2, PCIe signals PERp13, PERn13, PETp13, and PETn13, of the SFF-TA-1008 connector, transition from being configured as host A, PCIe lane 7 to host A, Ethernet port 3, PCIe signals PERp14, PERn14, PETp14, and PETn14, of the SFF-TA-1008 connector, transition from being configured as host B, PCIe lane 6 to host B, Ethernet port 2, and PCIe signals PERp15, PERn15, PETp15, and PETn15, of the SFF-TA-1008 connector, transition from being configured as host B, PCIe lane 7 to host B, Ethernet port 3.

In some embodiments, a method of selecting operating mode for a storage device, the storage device being connected to a storage device controller via a first interface, wherein the storage device controller is connected to a host device via a second interface, the method includes determining a status of a signal of the second interface; determining an operating mode of the storage device based on the status of the signal at the second interface; and determining a status of a dual port pin of the host device to determine if the storage device is operating in a single port mode or a dual port mode.

In some embodiments, the storage device is one of a new form factor 1 (NF1) solid state drive (SSD), an Ethernet SSD (eSSD), or an embedded SSD, and the storage device controller is a field programmable gate array (FPGA) or an application specific integrated circuit (ASIC), the first interface is a peripheral component interconnect express (PCIe) interface or a U.2 connector, and the second interface is a small form factor (SFF)-technology affiliate (TA)-1008 connector, operating modes of the storage device are a non-volatile memory express (NVMe) mode or a NVMe over fabrics (NVMe-oF) mode, the status of the signal at the second interface is the status of the signal at a reserved for future use (RFU) pin of the SFF-TA-1008 connector, the storage device operates in the NVMe mode when the status of the signal at the RFU pin of the SFF-TA-1008 connector is high and the storage device operates in the NVMe-oF mode when the status of the signal at the RFU pin of the SFF-TA-1008 connector is low, and the storage device operates in the dual port mode when the status of the dual port pin is low and the storage device operates in the single port mode when the status of the dual port pin is high.

In some embodiments, the method further includes downloading an NVMe-oF image or microcode for the dual port mode to the storage device, when the storage device is operating in the dual port NVMe-oF mode, downloading an NVMe-oF image or microcode for the single port mode to the storage device, when the storage device is operating in the single port NVMe-oF mode, downloading an NVMe image or microcode for the dual port mode to the storage device, when the storage device is operating in the dual port NVMe mode, and downloading an NVMe image or microcode for the single port mode to the storage device, when the storage device is operating in the single port NVMe mode.

BRIEF DESCRIPTION OF THE DRAWINGS

These and other features of some example embodiments of the present disclosure will be appreciated and understood with reference to the specification, claims, and appended drawings, wherein:

DETAILED DESCRIPTION

Figure 1:
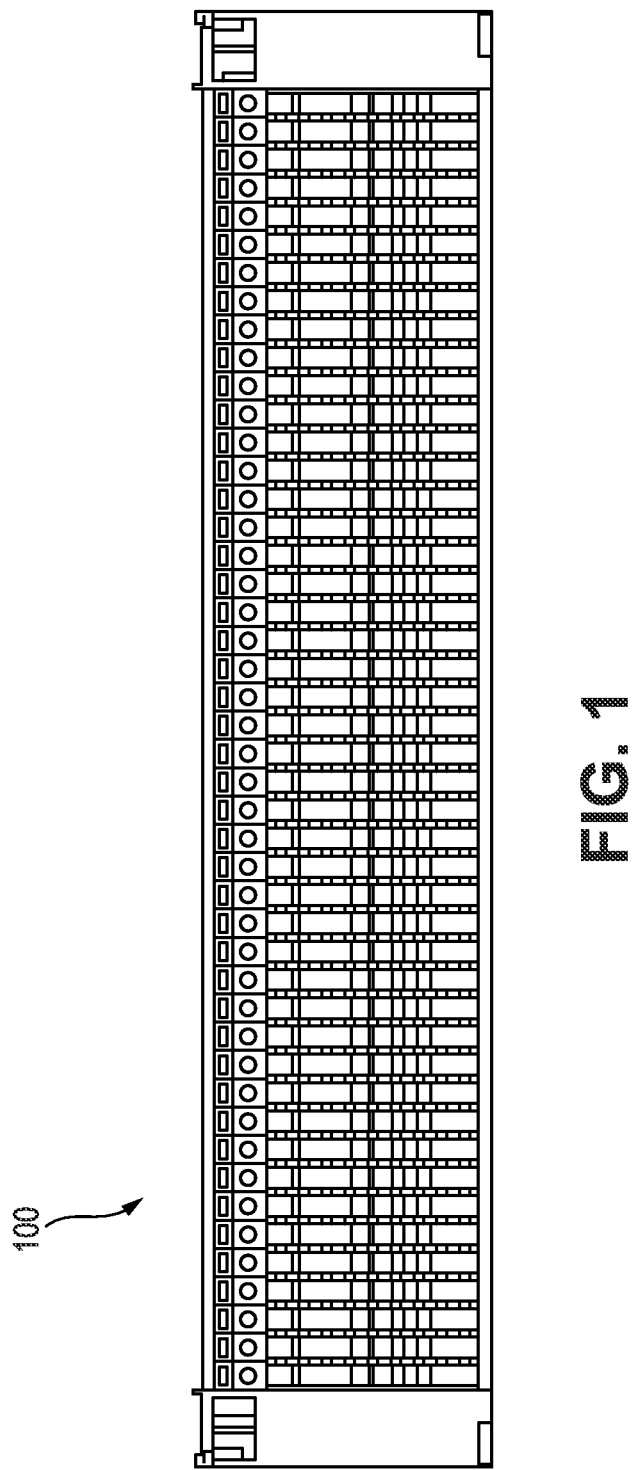
FIG. 1 illustrates a SFF-TA-1008 connector, according to some embodiments of the present disclosure.

The detailed description set forth below in connection with the appended drawings is intended as a description of some example embodiments of a SFF-TA-100X based multi-mode protocols solid state devices provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Non-volatile memory (NVM) express (NVMe) is a standard that defines a register-level interface for host software to communicate with a non-volatile memory subsystem (e.g., a solid state drive (SSD)) over a Peripheral Component Interconnect Express (PCIe) bus. NVMe is an alternative to the Small Computer System Interface (SCSI) standard for connecting and transferring data between a host and a peripheral target storage device or system. PCIe-connected NVMe SSDs allow applications to communicate directly to storage.

An Ethernet SSD (eSSD) may utilize an SSD (e.g., U.2) connector to interface with a system via a mid-plane over the PCIe bus. U.2 (SFF-8639) is a computer interface for connecting SSDs to a computer. A U.2 connector can support either two Serial Advanced Technology Attachment (SATA) or Serial Attached SCSI (SAS) ports and up to four lanes (X4) of parallel I/O in PCIe SSDs. If unused, the two PCIe lanes 1 and 2 may be optionally used as additional SAS ports if required. The U.2 connector is standardized for NVMe and supports PCIe 3.0 X4, providing, for example, five times the speed of a SATA SSD.

NVMe over fabrics (NVMe-oF) is an extension to the NVMe standard enabling operation over a variety of fabrics (or interconnects) other than PCIe. Herein, the term "fabric," represents a network topology in which network nodes can pass data to each other through a variety of interconnecting protocols, ports, and switches. For example, Ethernet-attached SSDs may attach directly to a fabric, and in this case the fabric is the Ethernet.

NVMe-oF enables the use of alternate transports to PCIe that extend the distances across which an NVMe host device and NVMe storage drive or subsystem can connect. Therefore, NVMe-oF is a technology specification designed to enable nonvolatile memory express message-based commands to transfer data directly between a host computer and a target solid-state storage device (e.g., eSSD or NVMe-oF device) or system over a network, such as Ethernet, Fibre Channel (FC) or InfiniBand. When configured to support the NVMe-oF standard, a system can support various fabrics including not only Ethernet, but also, Fibre Channel, InfiniBand, and other network fabrics. For example, eSSDs may attach directly to a fabric, and in this case the fabric is the Ethernet. An eSSD may refer to an SSD that may support the NVMe-oF protocols.

Various SSD connectors may be utilized for exchanging data with SSDs including, for example, U.2 connectors (24 Giga bites per second (Gbps) is likely to be maximum speed for SAS4 and PCIe generation 4 protocols), or SFF-TA-100X, where X can be 2, 6, 7, 8 etc.

With the advent of 50G and/or 100G Ethernet SSD (eSSD) and PCIe gen 5, U2 connectors may not be capable to scale up. SFF-TA-100X may support much higher data transaction such PCIe gen 5 and beyond. However, SFF-TA-100X may not support multi-mode or protocols such as NVMe or NVMe-oF. Therefore, some example embodiments may include a single common SFF-TA-100X (e.g., SFF-TA-1008) device which can support multiple protocols such as NVMe or NVMe-oF and can be used in various products. The SSD devices may include FPGA+SSD, Fabric-attached SSD or eSSD as well as SSDs.

Some embodiments of the present disclosure include a SFF-TA-100X (e.g., SFF-TA-1008) device which can support multiple protocols such as NVMe or NVMe-oF. The proposed multi-mode device can support either NVMe or NVMe-oF by detecting information from a known location or "Chassis Type" or "Protocol Selector" pin in the SFF-TA-100X (e.g., SFF-TA-1008) connector.

For example, an SFF-TA-1006 SSD may be used in data centers, for example, optimized as scalable main storage and acceleration in server and storage systems. The size of SFF-TA-1006 SSD is 31.5 mm×111.5 mm×5.75 or 7.55 mm and supports up to 12 W caseless. An SFF-TA-1006 SSD also supports SFF-TA-1002 1C (e.g., PCIe x4). An SFF-TA-1006 SSD supports PCIe up to 32 GT/s. An SFF-TA-1006 SSD has high-capacity or high-density NVMe form factor, e.g., up to 36 modules across 1 U rack space and/or up to 12 14×18 mm packages per module (e.g., 432 packages/U). An SFF-TA-1006 SSD also supports integrated data-centric computation and provides case & case-less options.

In some embodiments, the SSD may be SFF-8201 2.5" drive form factor dimensions; SFF-8223 2.5" drive form factor with serial connector; SFF-8301 3.5" drive form factor dimensions; or SFF-8323 3.5" drive form dactor with serial connector. SFF-100x is a series of form factors all using the SFF-1002 connector.

As another example, FIG. 1 illustrates an SFF-TA-1008 connector. As shown in FIG. 1, an SFF-TA-1008 connector 100 may be attached to a FPGA+SSD device, and the combination may be applicable to data centers (e.g., 1 U and 2 U optimized server and storage enclosure). The different sizes of the SFF-TA-1008-SSD (e.g., FPGA+SSD connected to the SFF-TA-1008 connector) are 7.5×76×104.9 mm that supports up to 25 W, 7.5×76×142.2 mm that supports up to 35 W, 16.8×76×104.9 mm that supports up to 70 W, and 16.8×76×142.2 mm that supports up to 70 W. An SFF-TA-1008-SSD supports SFF-TA-1002 1C, 2C, and/or 4C (e.g., PCIe x4-x16). An SFF-TA-1008 SSD supports PCIe gen 5 up to 32 GT/s, 802.3 to 112 GT/s. An SFF-TA-1008-SSD has high-capacity and/or high-density NVMe form factor. For example, the 7.5 mm form factor SFF-TA-1008-SSD (e.g., 7.5×76×104.9 mm that supports up to 25 W, 7.5×76×142.2 mm that supports up to 35 W) supports up to 48 modules, for example, 104.9 up to 24 14×18 mm packages per module (576/U) or 142.2 up to 48 14×18 mm packages per module (960/U). For example, the 16.8 mm form factor SFF-TA-1008-SSD (e.g., 16.8×76×104.9 mm that supports up to 70 W and 16.8×76×142.2 mm that supports up to 70 W) supports up to 24 modules or up to 48 14×18 mm flash packages per module (960/U). An SFF-TA-1008-SSD supports data-centric computation, for example, an SFF-TA-1008-SSD reduces packages to free up space for integrated accelerator. An SFF-TA-1008 SSD may include a case for electrostatic discharge (ESD) protection and hot-plug support and aligns with ZSFF 223 and ZSFF 224 (Gen-Z Scalable Form Factors). The case may also be used as heat sink or spreader for managing the thermal.

In some embodiments, in SFF-TA-1008 connector, the reserved for future use (RFU) pin may be used as "Chassis Type or Protocol Selector." For example, when the RFU pin of the SFF-TA-1008 connector is low, it represents the NVMe protocol or chassis. Alternatively, when the RFU pin is high, the device (e.g., FPGA+SSD connected to the SFF-TA-1008 connector) may detect that the device is present in a NVMe-oF chassis and operate accordingly or vice versa. For example, in some embodiments according to the present disclosure, the RFU pin may be redefined by RFU=NVMe-oF mode, to enable an SFF-TA-100X device (e.g., FPGA+SSD connected to the SFF-TA-1008 connector) to support both the NVMe and the NVMe-oF protocol. For example, a device (e.g., FPGA+SSD connected to the SFF-TA-1008 connector) may be able to operate in different Ethernet speeds from 50 G up to 100 G or higher, without any changes to their hardware. For each of the NVMe mode and the NVMe-oF mode of operation of the FPGA+SSD connected to the SFF-TA-1008 connector, the SFF-TA-1008 connector operates in X4 single port, X4 dual port, X8 single port, X8 dual port, X16 single port, and X16 dual port modes.

In some embodiments, if present in the NVMe chassis, the device (e.g., FPGA+SSD connected to the SFF-TA-1008 connector) will conform to table 2 of Enterprise Data Center Small Form Factor specification revision 0.9, as shown below (Table 1). The below table (Table 1) illustrates standard SFF-TA-1008 PCIe lanes connectivity in single and dual port implementations, if the RFU pin is low or if the device (e.g., FPGA+SSD connected to the SFF-TA-1008 connector) is present in the NVMe chassis.

TABLE 1

Standard SFF-TA-1008 PCIe lanes connectivity in single and dual port implementations.

| PCIe lanes | x4 Single Port (1 port x4) | x4 Dual Port (2 ports x2) | X8 Single Port (1 port x8) | x8 Dual Port (2 ports x4) | x16 Single Port (1 port x16) | x16 Dual Port (2 ports x8) |
|---|---|---|---|---|---|---|
| PERp0, PERn0, PETp0, PETn0 | Host A, lane 0 | Host A, lane 0 | Host A, lane 0 | Host A, lane 0 | Host A, lane 0 | Host A, lane 0 |

TABLE 1-continued

Standard SFF-TA-1008 PCIe lanes connectivity in single and dual port implementations.

| PCIe lanes | x4 Single Port (1 port x4) | x4 Dual Port (2 ports x2) | X8 Single Port (1 port x8) | x8 Dual Port (2 ports x4) | x16 Single Port (1 port x16) | x16 Dual Port (2 ports x8) |
|---|---|---|---|---|---|---|
| PERp1, PERn1, PETp1, PETn1 | Host A, lane 1 | Host A, lane 1 | Host A, lane 1 | Host A, lane 1 | Host A, lane 1 | Host A, lane 1 |
| PERp2, PERn2, PETp2, PETn2 | Host A, lane 2 | Host B, lane 0 | Host A, lane 2 | Host B, lane 0 | Host A, lane 2 | Host B, lane 0 |
| PERp3, PERn3, PETp3, PETn3 | Host A, lane 3 | Host B, lane 1 | Host A, lane 3 | Host B, lane 1 | Host A, lane 3 | Host B, lane 1 |
| PERp4, PERn4, PETp4, PETn4 | No connect | No connect | Host A, lane 4 | Host A, lane 2 | Host A, lane 4 | Host A, lane 2 |
| PERp5, PERn5, PETp5, PETn5 | No connect | No connect | Host A, lane 5 | Host A, lane 3 | Host A, lane 5 | Host A, lane 3 |
| PERp6, PERn6, PETp6, PETn6 | No connect | No connect | Host A, lane 6 | Host B, lane 2 | Host A, lane 6 | Host B, lane 2 |
| PERp7, PERn7, PETp7, PETn7 | No connect | No connect | Host A, lane 7 | Host B, lane 3 | Host A, lane 7 | Host B, lane 3 |
| PERp8, PERn8, PETp8, PETn8 | No connect | No connect | No connect | No connect | Host A, lane 8 | Host A, lane 4 |
| PERp9, PERn9, PETp9, PETn9 | No connect | No connect | No connect | No connect | Host A, lane 9 | Host A, lane 5 |
| PERp10, PERn10, PETp10, PETn10 | No connect | No connect | No connect | No connect | Host A, lane 10 | Host B, lane 4 |
| PERp11, PERn11, PETp11, PETn11 | No connect | No connect | No connect | No connect | Host A, lane 11 | Host B, lane 5 |
| PERp12, PERn12, PETp12, PETn12 | No connect | No connect | No connect | No connect | Host A, lane 12 | Host A, lane 6 |
| PERp13, PERn13, PETp13, PETn13 | No connect | No connect | No connect | No connect | Host A, lane 13 | Host A, lane 7 |
| PERp14, PERn14, PETp14, PETn14 | No connect | No connect | No connect | No connect | Host A, lane 14 | Host B, lane 6 |
| PERp15, PERn15, PETp15, PETn15 | No connect | No connect | No connect | No connect | Host A, lane 15 | Host B, lane 7 |

In some embodiments, if the device (e.g., FPGA+SSD connected to the SFF-TA-1008 connector) is present in the NVMe-oF chassis, for example, when the RFU pin is high, then the Ethernet ports of the SFF-TA-1008 connector will use only PCIe as defined in table 2 below. Currently, there is no standard implementation specified by the NVMe.Org. In some embodiments, the selection of protocol (e.g., NVMe or NVMe-oF) may be determined prior to download of the FPGA image. The giga-transceivers may be used for either PCIe or Ethernet protocol. In such a case, all PCIe ports are capable of communicating to or from a local central processing unit (CPU) of a motherboard and/or a baseboard management controller (BMC) of a switch, and are used as control plane to perform any normal PCIe transactions, device initialization and/or for firmware upgrade between a BMC or a CPU and the device (e.g., SSD). The below table (Table 2) illustrates SFF-TA-1008 PCIe lanes connectivity in single port, dual port implementations & NVMe-oF mode, for example, when the RFU pin is high, the device (e.g., FPGA+SSD connected to the SFF-TA-1008 connector) is present in the NVMe-oF chassis.

TABLE 2

SFF-TA-1008 PCIe lanes connectivity in single port, dual port implementations & NVMe-oF mode by re defining RFU pin.

| PCIe lanes | (X4 Single Port) → X2 Single Port and 1 × 50 G Ethernet Port | (x4 Dual Port) (2 ports x1) + 2 × 25 G Ethernet Ports | (X8 Single Port) → (1 port x4) + 1 × 100 G Ethernet | (x8 Dual Port) → (2 ports x2) + 2 × 50 G Ethernet ports | (x16 Single) Port → (1 port x8) + 2 × 100 G Ethernet ports | (x16 Dual Port) → (2 ports x4) + 2 × 100 G |
| --- | --- | --- | --- | --- | --- | --- |
| PERp0, PERn0, PETp0, PETn0 | Host A, lane 0 | Host A, lane 0 | Host A, lane 0 | Host A, lane 0 | Host A, lane 0 | Host A, lane 0 |
| PERp1, PERn1, PETp1, PETn1 | Host A, lane 1 | Host A, Ethernet 0 | Host A, lane 1 | Host A, lane 1 | Host A, lane 1 | Host A, lane 1 |
| PERp2, PERn2, PETp2, PETn2 | Host A, Ethernet 0 | Host B, lane 0 | Host A, lane 2 | Host A, Ethernet 0 | Host A, lane 2 | Host B, lane 0 |
| PERp3, PERn3, PETp3, PETn3 | Host A, Ethernet 1 | Host B, Ethernet 1 | Host A, lane 3 | Host A, Ethernet 1 | Host A, lane 3 | Host B, lane 1 |
| PERp4, PERn4, PETp4, PETn4 | No connect | No connect | Host A, Ethernet 0 | Host B, lane 0 | Host A, lane 4 | Host A, lane 2 |
| PERp5, PERn5, PETp5, PETn5 | No connect | No connect | Host A, Ethernet 1 | Host B, lane 1 | Host A, lane 5 | Host A, lane 3 |
| PERp6, PERn6, PETp6, PETn6 | No connect | No connect | Host A, Ethernet 2 | Host B, Ethernet 2 | Host A, lane 6 | Host B, lane 2 |
| PERp7, PERn7, PETp7, PETn7 | No connect | No connect | Host A, Ethernet 3 | Host B, Ethernet 3 | Host A, lane 7 | Host B, lane 3 |
| PERp8, PERn8, PETp8, PETn8 | No connect | No connect | No connect | No connect | Host A, Ethernet 0 | Host A, Ethernet 0 |
| PERp9, PERn9, PETp9, PETn9 | No connect | No connect | No connect | No connect | Host A, Ethernet 1 | Host A, Ethernet 1 |
| PERp10, PERn10, PETp10, PETn10 | No connect | No connect | No connect | No connect | Host A, Ethernet 2 | Host B, Ethernet 0 |
| PERp11, PERn11, PETp11, PETn11 | No connect | No connect | No connect | No connect | Host A, Ethernet 3 | Host B, Ethernet 1 |
| PERp12, PERn12, PETp12, PETn12 | No connect | No connect | No connect | No connect | Host A, Ethernet 4 | Host A, Ethernet 2 |
| PERp13, PERn13, PETp13, PETn13 | No connect | No connect | No connect | No connect | Host A, Ethernet 5 | Host A, Ethernet 3 |
| PERp14, PERn14, PETp14, PETn14 | No connect | No connect | No connect | No connect | Host A, Ethernet 6 | Host B, Ethernet 2 |
| PERp15, PERn15, PETp15, PETn15 | No connect | No connect | No connect | No connect | Host A, Ethernet 7 | Host B, Ethernet 3 |

As discussed above, when the RFU pin of the SFF-TA-1008 connector is high, the FPGA+SSD connected to the SFF-TA-1008 connector, operates in the NVMe-oF mode and when the RFU pin of the SFF-TA-1008 connector is low, the FPGA+SSD connected to the SFF-TA-1008 connector operates in the NVMe mode. As shown in table 2 above, in some embodiments, when the device (e.g., FPGA+SSD attached to the SFF-TA-1008 connector) and the SFF-TA- 1008 connector are operating in the NVMe-oF and the X4 single port mode (e.g., X2 Single Port and 1×50 G Ethernet Port), respectively, the PCIe signals PERp2, PERn2, PETp2, and PETn2, of the SFF-TA-1008 connector, may be configured as host A and Ethernet port 0, and the PCIe signals PERp3, PERn3, PETp3, and PETn3, of the SFF-TA-1008 connector, may be configured as Ethernet port 1 of host A. Host A is used to represent or describe the first port of dual port configuration and host B is used to represent the second port.

As evident from table 1 (NVMe mode) and table 2 (NVMe-oF mode), in some embodiments, in the X4 single port mode, when the RFU pin of the SFF-TA-1008 connector transitions from low (NVMe mode) to (NVMe-of mode) high, e.g., the FPGA+SSD connected to the SFF-TA-1008 connector transitions from NVMe mode to NVMe-of mode, the PCIe signals PERp2, PERn2, PETp2, and PETn2, of the SFF-TA-1008 connector, transition from being configured as host A, PCIe lane 2 to host A, Ethernet port 0, and the PCIe signals PERp3, PERn3, PETp3, and PETn3, of the SFF-TA-1008 connector, transition from being configured as host A, PCIe lane 3 to host A, Ethernet port 1.

In some embodiments, when the device (e.g., FPGA+SSD connected to the SFF-TA-1008 connector) and the SFF-TA-1008 connector are operating in the NVMe-oF and X4 dual port mode (e.g., (2 ports x1)+(2×25G Ethernet Ports)), respectively, the PCIe signals PERp1, PERn1, PETp1, and PETn1, of the SFF-TA-1008 connector, may be configured as host A and Ethernet port 0, and the PCIe signals PERp3, PERn3, PETp3, and PETn3, of the SFF-TA-1008 connector, may be configured as host B and Ethernet port 1.

As evident from table 1 (NVMe mode) and table 2 (NVMe-oF mode), in some embodiments, in the X4 dual port mode, when the RFU pin of the SFF-TA-1008 connector transitions from low (NVMe mode) to (NVMe-of mode) high, e.g., the FPGA+SSD connected to the SFF-TA-1008 connector transitions from NVMe mode to NVMe-of mode, the PCIe signals PERp1, PERn1, PETp1, and PETn1, of the SFF-TA-1008 connector, transition from being configured as host A, PCIe lane 1 to host A, Ethernet port 0, and the PCIe signals PERp3, PERn3, PETp3, and PETn3, of the SFF-TA-1008 connector, transition from being configured as host B, PCIe lane 1 to host B, Ethernet port 1.

In some embodiments, when the device (e.g., FPGA+SSD connected to the SFF-TA-1008 connector) and the SFF-TA-1008 connector are operating in the NVMe-oF and X8 single port mode (e.g., (1 port x4)+(1×100 G Ethernet)), respectively, the PCIe signals PERp4, PERn4, PETp4, and PETn4, of the SFF-TA-1008 connector, may be configured as host A and Ethernet port 0, the PCIe signals PERp5, PERn5, PETp5, and PETn5, of the SFF-TA-1008 connector, may be configured as host A and Ethernet port 1, the PCIe signals PERp6, PERn6, PETp6, and PETn6, of the SFF-TA-1008 connector, may be configured as host A and Ethernet port 2, and the PCIe signals PERp7, PERn7, PETp7, and PETn7, of the SFF-TA-1008 connector, may be configured as host A and Ethernet port 3.

As evident from table 1 (NVMe mode) and table 2 (NVMe-oF mode), in some embodiments, in the X8 single port mode, when the RFU pin of the SFF-TA-1008 connector transitions from low (NVMe mode) to (NVMe-of mode) high, e.g., the FPGA+SSD connected to the SFF-TA-1008 connector transitions from NVMe mode to NVMe-of mode, the PCIe signals PERp4, PERn4, PETp4, and PETn4, of the SFF-TA-1008 connector, transition from being configured as host A, PCIe lane 4 to host A, Ethernet port 0, the PCIe signals PERp5, PERn5, PETp5, and PETn5, of the SFF-TA-1008 connector, transition from being configured as host A, PCIe lane 5 to host A, Ethernet port 1, the PCIe signals PERp6, PERn6, PETp6, and PETn6, of the SFF-TA-1008 connector, transition from being configured as host A, PCIe lane 6 to host A, Ethernet port 2, and the PCIe signals PERp7, PERn7, PETp7, and PETn7, of the SFF-TA-1008 connector, transition from bring configured as host A, PCIe lane 7 to host A, Ethernet port 3.

In some embodiments, when the device (e.g., FPGA+SSD connected to the SFF-TA-1008 connector) and the SFF-TA-1008 connector are operating in the NVMe-oF mode and X8 dual port mode (e.g., (1 port x4)+(1×100 G Ethernet)), respectively, the PCIe signals PERp2, PERn2, PETp2, and PETn2, of the SFF-TA-1008 connector, may be configured as host A and Ethernet port 0, the PCIe signals PERp3, PERn3, PETp3, and PETn3, of the SFF-TA-1008 connector, may be configured as host A and Ethernet port 1, the PCIe signals PERp6, PERn6, PETp6, and PETn6, of the SFF-TA-1008 connector, may be configured as host B and Ethernet port 2, and the PCIe signals PERp7, PERn7, PETp7, and PETn7, of the SFF-TA-1008 connector, may be configured as host B and Ethernet port 3.

As evident from table 1 (NVMe mode) and table 2 (NVMe-oF mode), in some embodiments, in the X8 dual port mode, when the RFU pin of the SFF-TA-1008 connector transitions from low (NVMe mode) to (NVMe-of mode) high, e.g., the FPGA+SSD connected to the SFF-TA-1008 connector transitions from NVMe mode to NVMe-of mode, the PCIe signals PERp2, PERn2, PETp2, and PETn2, of the SFF-TA-1008 connector, transition from being configured as host B, PCIe lane 0 to host A, Ethernet port 0, the PCIe signals PERp3, PERn3, PETp3, and PETn3, of the SFF-TA-1008 connector, transition from being configured as host B, PCIe lane 1 to host A, Ethernet port 1, the PCIe signals PERp6, PERn6, PETp6, and PETn6, of the SFF-TA-1008 connector, transition from being configured as host B, PCIe lane 2 to host B, Ethernet port 2, and the PCIe signals PERp7, PERn7, PETp7, and PETn7, of the SFF-TA-1008 connector, transition from being configured as host B, lane 3 to host B, Ethernet port 3.

In some embodiments, when the device (e.g., FPGA+SSD connected to the SFF-TA-1008 connector) and the SFF-TA-1008 connector are operating in the NVMe-oF mode and X16 single port mode (e.g., (1 port x8)+(2×100 G Ethernet ports)), respectively, the PCIe signals PERp8, PERn8, PETp8, and PETn8, of the SFF-TA-1008 connector, may be configured as host A and Ethernet port 0, the PCIe signals PERp9, PERn9, PETp9, and PETn9, of the SFF-TA-1008 connector, may be configured as host A and Ethernet port 1, the PCIe signals PERp10, PERn10, PETp10, and PETn10, of the SFF-TA-1008 connector, may be configured as host A and Ethernet port 2, the PCIe signals PERp11, PERn11, PETp11, and PETn11, of the SFF-TA-1008 connector, may be configured as host A and Ethernet port 3, the PCIe signals PERp12, PERn12, PETp12, and PETn12, of the SFF-TA-1008 connector, may be configured as host A and Ethernet port 4, the PCIe signals PERp13, PERn13, PETp13, and PETn13, of the SFF-TA-1008 connector, may be configured as host A and Ethernet port 5, the PCIe signals PERp14, PERn14, PETp14, and PETn14, of the SFF-TA-1008 connector, may be configured as host A and Ethernet port 6, and the PCIe signals PERp15, PERn15, PETp15, and PETn15 of the SFF-TA-1008 connector, may be configured as host A and Ethernet port 7.

As evident from table 1 (NVMe mode) and table 2 (NVMe-oF mode), in some embodiments, in the X16 single port mode, when the RFU pin of the SFF-TA-1008 connector transitions from low (NVMe mode) to (NVMe-of mode) high, e.g., the FPGA+SSD connected to the SFF-TA-1008 connector transitions from NVMe mode to NVMe-of mode, the PCIe signals PERp8, PERn8, PETp8, and PETn8, of the SFF-TA-1008 connector, transition from being configured as host A, PCIe lane 8 to host A, Ethernet port 0, the PCIe signals PERp9, PERn9, PETp9, and PETn9, of the SFF-TA-1008 connector, transition from being configured as host A, PCIe lane 9 to host A, Ethernet port 1, the PCIe signals PERp10, PERn10, PETp10, and PETn10, of the SFF-TA-1008 connector, transition from being configured as host A, PCIe lane 10 to host A, Ethernet port 2, the PCIe signals PERp11, PERn11, PETp11, and PETn11, of the SFF-TA-1008 connector, transition from being configured as host A, PCIe lane 11 to host A, Ethernet port 3, the PCIe signals PERp12, PERn12, PETp12, and PETn12, of the SFF-TA-1008 connector, transition from being configured as host A, PCIe lane 12 to host A, Ethernet port 4, the PCIe signals PERp13, PERn13, PETp13, and PETn13, of the SFF-TA-1008 connector, transition from being configured as host A, PCIe lane 13 to host A, Ethernet port 5, the PCIe signals PERp14, PERn14, PETp14, and PETn14, of the SFF-TA-1008 connector, transition from being configured as host A, lane 14 to host A, Ethernet port 6, and the PCIe signals PERp15, PERn15, PETp15, and PETn15, of the SFF-TA-1008 connector, transition from being configured as host A, lane 15 to host A, Ethernet port 7.

In some embodiments, when the device (e.g., FPGA+SSD connected to the SFF-TA-1008 connector) is operating in the NVMe-oF, X16 dual port mode (e.g., (2 ports x4)+(2×100 G)), the PCIe signals PERp8, PERn8, PETp8, and PETn8, of the SFF-TA-1008 connector, may be configured as host A and Ethernet port 0, the PCIe signals PERp9, PERn9, PETp9, and PETn9, of the SFF-TA-1008 connector, may be configured as host A and Ethernet port 1, the PCIe signals PERp10, PERn10, PETp10, and PETn10, of the SFF-TA-1008 connector, may be configured as host B and Ethernet port 0, the PCIe signals PERp11, PERn11, PETp11, and PETn11, of the SFF-TA-1008 connector, may be configured as host B and Ethernet port 1, the PCIe signals PERp12, PERn12, PETp12, and PETn12, of the SFF-TA-1008 connector, may be configured as host A and Ethernet port 2, the PCIe signals PERp13, PERn13, PETp13, and PETn13, of the SFF-TA-1008 connector, may be configured as host A and Ethernet port 3, the PCIe signals PERp14, PERn14, PETp14, and PETn14, of the SFF-TA-1008 connector, may be configured as host B and Ethernet port 2, and the PCIe signals PERp15, PERn15, PETp15, and PETn15, of the SFF-TA-1008 connector, may be configured as host B and Ethernet port 3.

As evident from table 1 (NVMe mode) and table 2 (NVMe-oF mode), in some embodiments, in the X16 dual port mode, when the RFU pin of the SFF-TA-1008 connector transitions from low (NVMe mode) to (NVMe-of mode) high, the PCIe signals PERp8, PERn8, PETp8, and PETn8, of the SFF-TA-1008 connector, transition from being configured as host A, PCIe lane 4 to host A, Ethernet port 0, the PCIe signals PERp9, PERn9, PETp9, and PETn9, of the SFF-TA-1008 connector, transition from being configured as host A, PCIe lane 5 to host A and Ethernet port 1, the PCIe signals PERp10, PERn10, PETp10, and PETn10, of the SFF-TA-1008 connector, transition from being configured as host B, PCIe lane 4 to host B, Ethernet port 0, the PCIe signals PERp11, PERn11, PETp11, and PETn11, of the SFF-TA-1008 connector, transition from being configured as host B, PCIe lane 5 to host B, Ethernet port 1, the PCIe signals PERp12, PERn12, PETp12, and PETn12, of the SFF-TA-1008 connector, transition from being configured as host A, PCIe lane 6 to host A, Ethernet port 2, the PCIe signals PERp13, PERn13, PETp13, and PETn13, of the SFF-TA-1008 connector, transition from being configured as host A, PCIe lane 7 to host A, Ethernet port 3, the PCIe signals PERp14, PERn14, PETp14, and PETn14, of the SFF-TA-1008 connector, transition from being configured as host B, PCIe lane 6 to host B, Ethernet port 2, and the PCIe signals PERp15, PERn15, PETp15, and PETn15, of the SFF-TA-1008 connector, transition from being configured as host B, PCIe lane 7 to host B, Ethernet port 3.

The below table (Table 3) illustrates a status of SFF-TA-1008 connector PCIe lanes connectivity in single port, dual port implementations & NVMe (when the RFU pin is low) or NVMe-oF (e.g., when the RFU pin is high) mode by re defining the RFU pin.

TABLE 3

SFF-TA-1008 connector PCIe lanes connectivity in single port, dual port implementations & NVMe (when the RFU pin is low) or NVMe-oF (e.g., when the RFU pin is high) mode by re defining the RFU pin.

| SFF-TA Pins PCIe lanes | (X4 Single Port) à X2 Single Port and 1 × 50G Ethernet Port RFU = NVMe-oF and DualPortEN# is de-asserted (high) | (x4 Dual Port) (2 ports x1) + 2 × 25G Ethernet Ports RFU = NVMe-oF and DualPortEN# is asserted (low) |
|---|---|---|
| PERp0, PERn0, PETp0, PETn0 | Host A, lane 0 (optional using as control plane) | Host A, lane 0 (optional using as control plane) |
| PERp1, PERn1, PETp1, PETn1 | Host A, lane 1 (optional using as control plane) | Host A, Ethernet 0 |
| PERp2, PERn2, PETp2, PETn2 | Host A, Ethernet 0 | Host B, lane 0 (optional using as control plane) |
| PERp3, PERn3, PETp3, PETn3 | Host A, Ethernet 1 | Host B, Ethernet 1 |

Figure 2A:
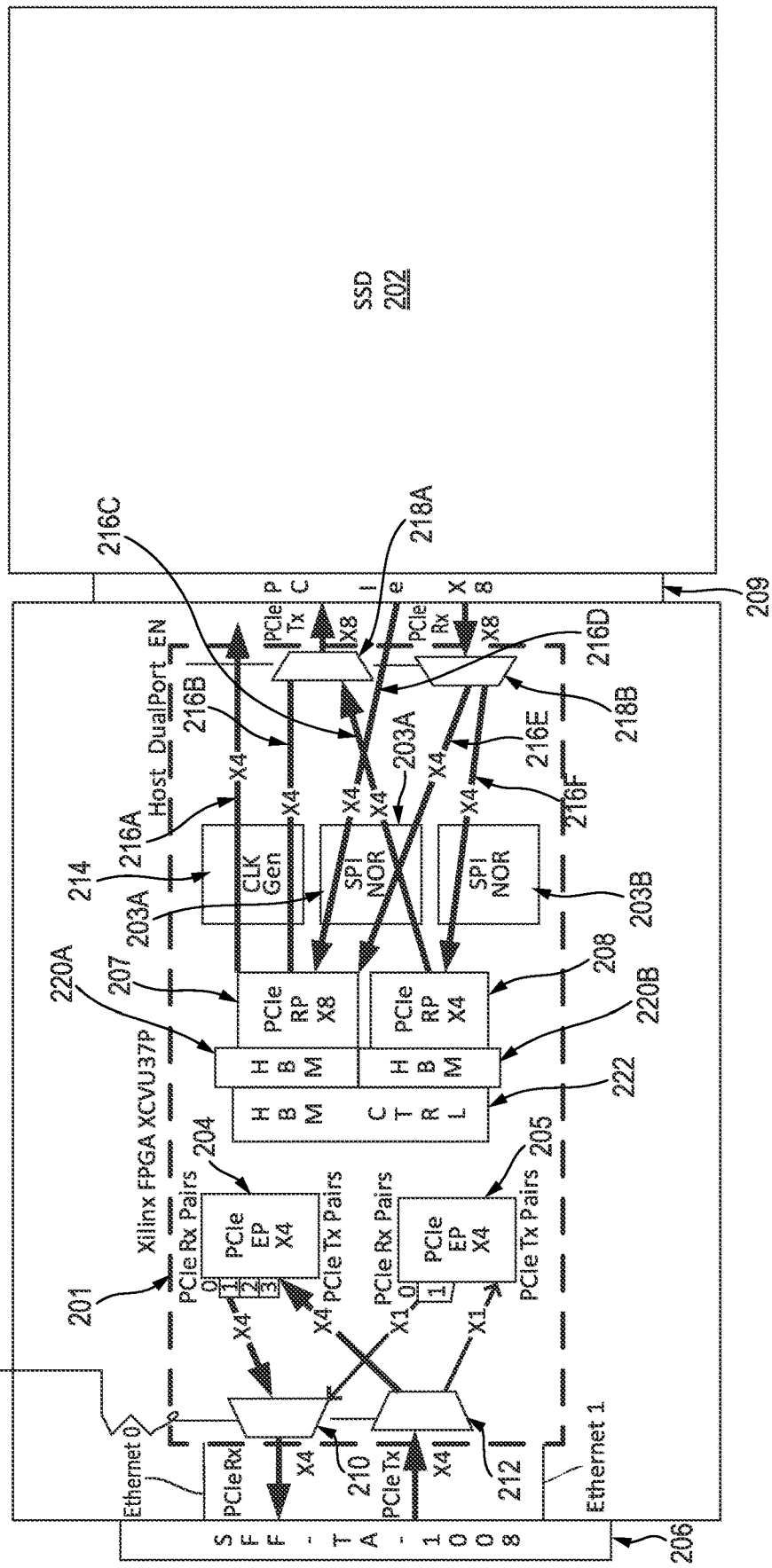
FIG. 2A illustrates a block diagram illustrating an example SSD device, according to some embodiments of the present disclosure.

FIG. 2A illustrates a block diagram illustrating an example SSD device 200, according to some embodiments of the present disclosure. The SSD device 200 may include a computing device, for example, a field programmable gate array (FPGA) 201 connected to a SSD 202 (e.g., a new form factor 1 (NF1) SSD, an eSSD, or an embedded SSD). The FPGA 201 may operate as a controller for the SSD 202 and may provide an interface between a SFF-TA-100X connector or interface, for example, a SFF-TA-1008 connector 206 and the SSD 202 and a plurality of flash drives, for example, 203A and 203B. The SFF-TA-1008 connector 206 may be connected to a motherboard and/or a BMC of a switch of a host device.

The FPGA 201 may interface with the SSD 202 via a PCIe interface 209 (e.g., PCIe X8 interface) through ports 207 (e.g., PCIe RP X8 port) and 208 (e.g., PCIe RP X4 port) and multiplexers 218A and 218B. For example, the port 207 of FPGA 201 is connected to a multiplexer 218A via PCIe X4 buses 216A and 216B. The port 207 of FPGA 201 is connected to a multiplexer 218B via PCIe X4 bus 216E. The port 208 of FPGA 201 is connected to the multiplexer 218A via PCIe X4 bus 216C and the port 208 of FPGA 201 is connected to the multiplexer 218B via PCIe X4 bus 216F.

The multiplexer 218A is connected to the SSD 202 via the PCIe X8 interface 209 through a PCIe X8 transmission bus and the multiplexer 218B is connected to the SSD 202 via the PCIe X8 interface 209 through a PCIe X8 receive bus. Therefore, the FPGA 201 may transmit data to the SSD 202 via the transmit multiplexer 218A though the ports 207 and 208 using the PCIe X4 transmission busses 216A, 216B, and 216C, and the FPGA 201 may receive data from the SSD 202 via the receive multiplexer 218B though the ports 207 and 208 using the PCIe X4 receive busses 216D, 216E, and 216F. Moreover, the port 207 is connected to a high bandwidth memory (HBM) 220A and the port 208 is connected to another HBM 220B. Each of the HBM 220A and the HBM 220B are connected to a HBM controller 222. In some embodiments, the FPGA 701 is also connected to flash drives 203A-203B and a clock circuit 214.

The SFF-TA-1008 connector 206 may be connected to the FPGA 201, via two PCIe X4 ports 204 and 205 through two multiplexers 210 and 212. The PCIe X4 port 204 may transmit signal or packets to a motherboard over a mid-plane via the SFF-TA-1008 connector 206 through the multiplexer 210 using a PCIe X4 bus and may receive signal or packets from a motherboard over a mid-plane via the SFF-TA-1008 connector 206 through the multiplexer 212 using another PCIe X4 bus. The PCIe X4 port 205 may transmit signal or packets to a motherboard over a mid-plane via the SFF-TA-1008 connector 206 through the multiplexer 210 using a PCIe X1 bus and may receive signal or packets from a motherboard over a mid-plane via the SFF-TA-1008 connector 206 through the multiplexer 212 using another PCIe X1 bus. The multiplexer 210 may transmit signal to the SFF-TA-1008 connector 206 via a PCIe X4 bus and the multiplexer 212 may receive signal from the SFF-TA-1008 connector 206 via another PCIe X4 bus.

In some embodiments, the RFU pin 224 of the SFF-TA-1008 connector, which is reserved for future use, is redefined by RFU=NVMe-oF mode, to enable the SSD 202 to support both NVMe and NVMe-oF protocol. For example, the SSD 202 may be able to operate in different Ethernet speeds from 50 G up to 100 G or higher, without any changes to their hardware based on the status (high or low) of the RFU pin 224. When the RFU pin 224 is high, for example, based on the instructions received from the motherboard or the BMC of a host device (via a general purpose input output (GPIO) connecting to the RFU) via the SFF-TA-1008 connector 206, the SSD 202 operates in the NVMe-oF mode, and the FPGA 201 may connect to the SFF-TA-1008 connector using Ethernet port 0 and Ethernet port 1. However, when the RFU pin 224 is low, for example, based on the instructions received from the motherboard or the BMC of a host device (via a GPIO connecting to the RFU) via the SFF-TA-1008 connector 206, the SSD 202 operates in the NVMe mode, and the FPGA 201 may connect to the SFF-TA-1008 connector using the PCIe ports 204, 205 and the multiplexers 210 and 212.

Figure 2B:
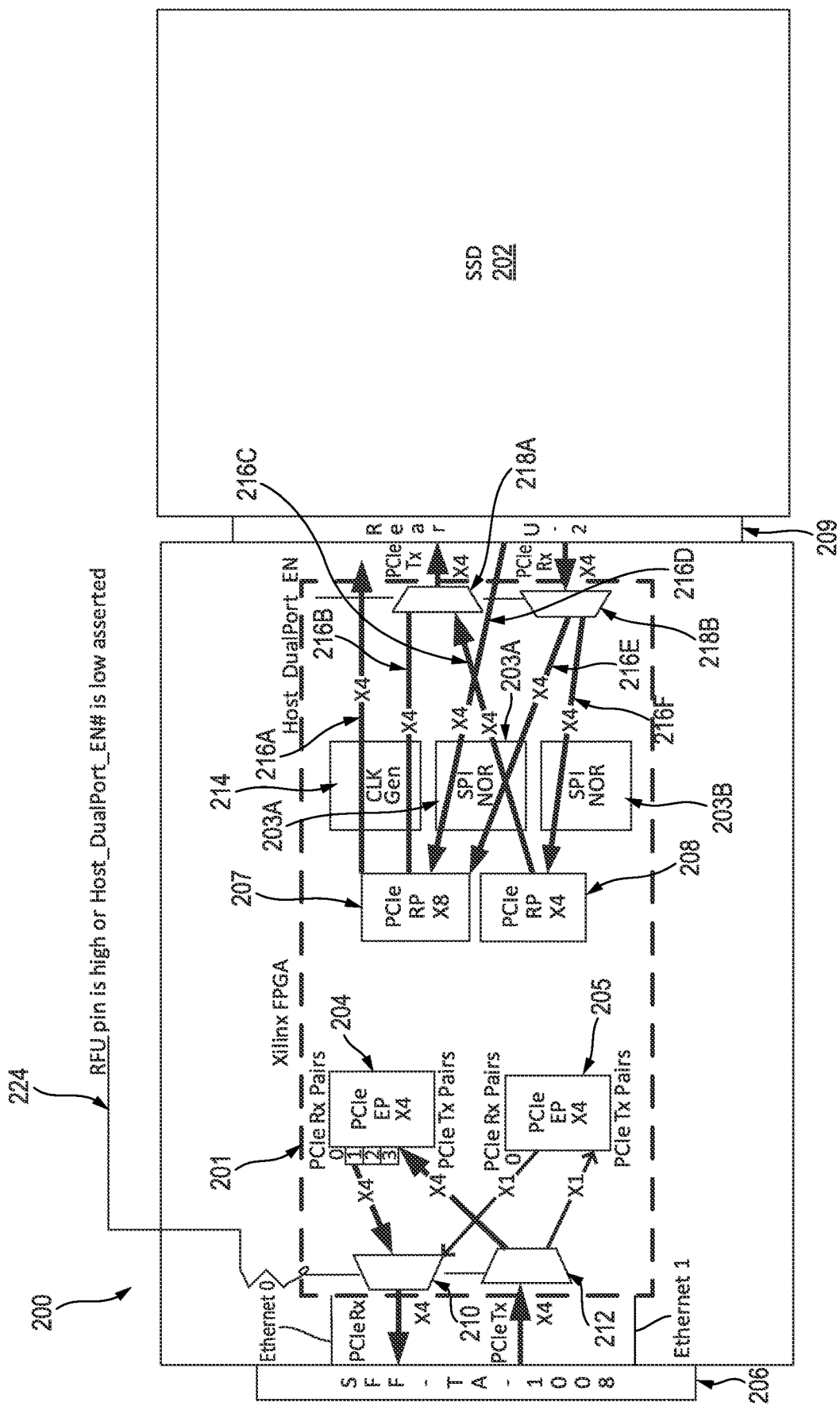
FIG. 2B illustrates another embodiment of the example SSD device of FIG. 2A, according to some embodiments of the present disclosure.

FIG. 2B illustrates another embodiment of the example SSD device 200 of FIG. 2A. The embodiment of FIG. 2B incorporates all the components of the embodiment of FIG. 2A, except, in the embodiment of FIG. 2B, the PCIe X8 interface 209 between the FPGA and the SSD 202, is replaced with a U.2 connector. The embodiment of FIG. 2B is also devoid of HBM 220A and HBM 220B connected to the ports 207 and 208, and the HBM controller 222 connected to each of the HBM 220A and the HBM 220B. In the embodiment of FIG. 2B, when the RFU pin 224 is high, i.e., when the SSD 202 is operating in the NVMe-oF mode, the FPGA 201 may connect to the SFF-TA-1008 connector using Ethernet port 1 and Ethernet port 2.

Figure 3:
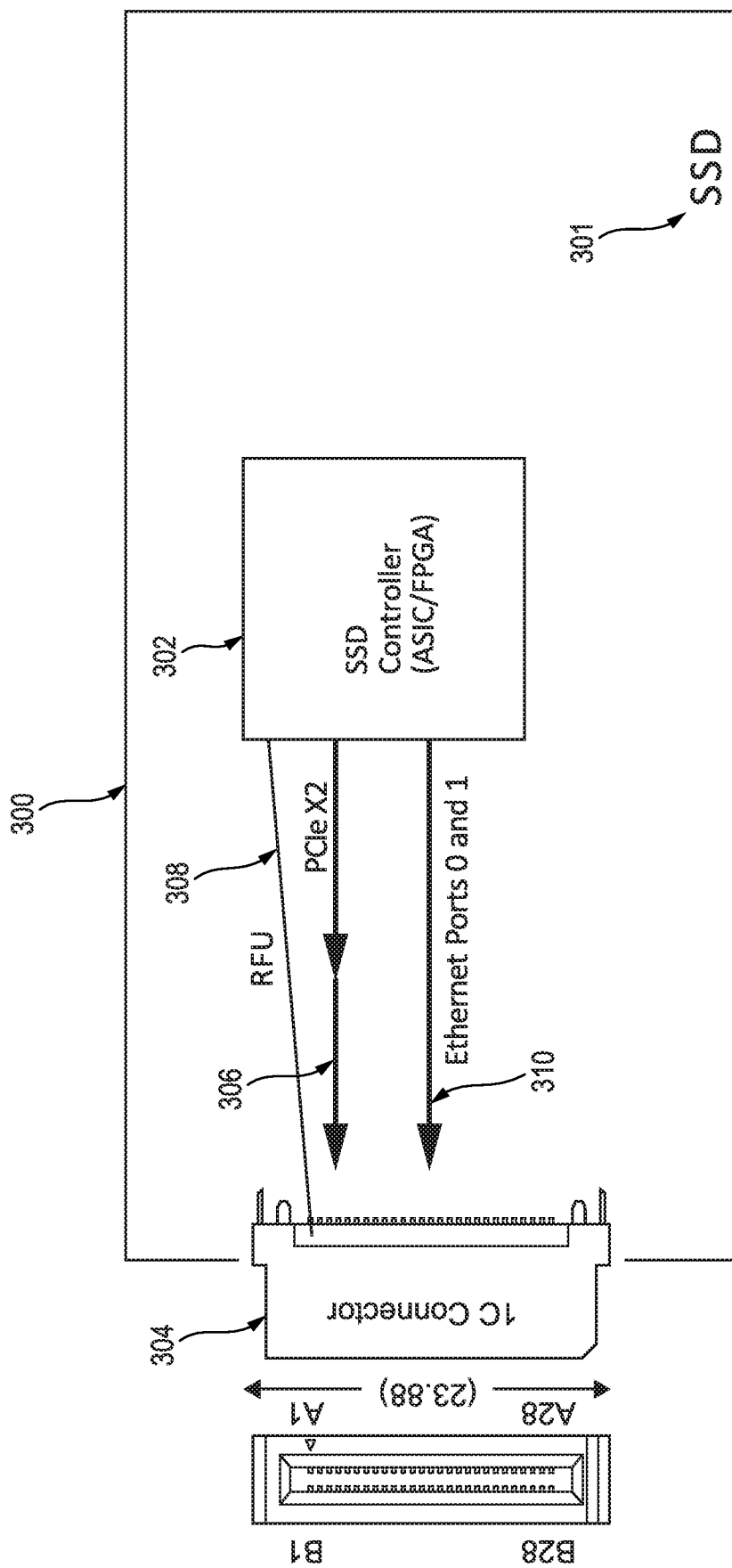
FIG. 3 illustrates an SSD device where an SSD and a SSD controller are embedded together, according to some embodiments of the present disclosure.

FIG. 3 illustrates an SSD device 300 where an SSD 301 and a SSD controller 302 are embedded together. The SSD controller 302 may be a FPGA device or an application specific integrated circuit (ASIC). In the SSD device 300, a SFF-TA-1008 connector 304 may be connected to the SSD controller 302 via a PCIe X2 port 306 and an Ethernet port 310 (e.g., Ethernet port 0 and Ethernet port 1). The SSD controller 302 may transmit or receive signal or packets to a motherboard over a mid-plane via the SFF-TA-1008 connector 304 through the PCIe X2 port 306 and the Ethernet port 310. In some embodiments, the RFU pin 308 of the SFF-TA-1008 connector 304, which is reserved for future use, is redefined by RFU=NVMe-oF mode, to enable the SSD 301 to support both NVMe and NVMe-oF protocol. For example, the SSD 301 may be able to operate in different Ethernet speeds from 50 G up to 100 G or higher (NVMe-oF mode), without any changes to their hardware based on the status (high) of the RFU pin 308. When the RFU pin 308 is high, i.e., when the SSD 301 is operating in the NVMe-oF mode, the SSD controller 302 may connect to the SFF-TA-1008 connector 304 using the Ethernet port 310 (e.g., Ethernet port 0 and Ethernet port 1) and may operate in different Ethernet speeds from 50 G up to 100 G or higher.

Figure 4:
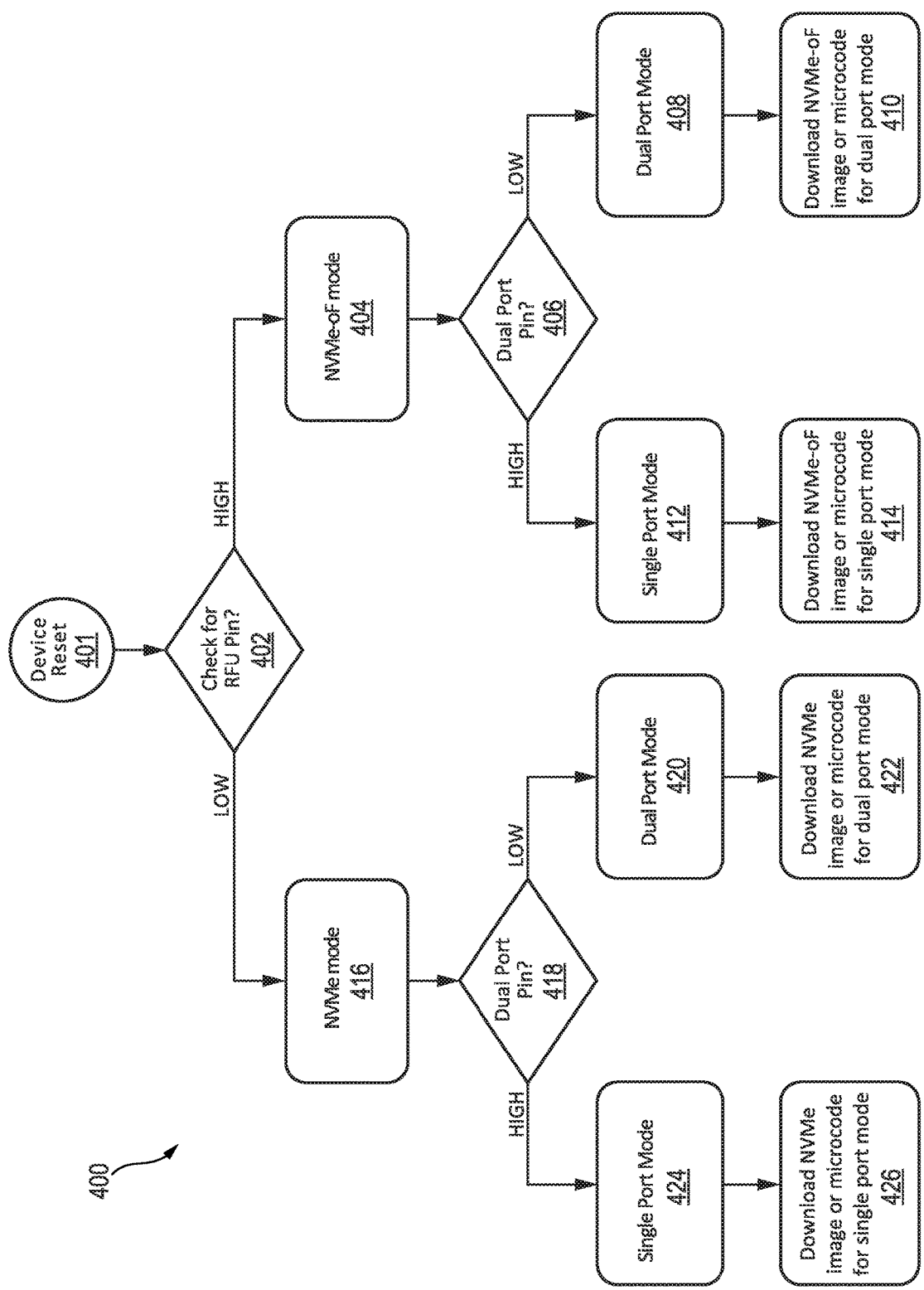
FIG. 4 illustrates an example method of mode or protocol selection for a SSD device, according to some embodiments of the present disclosure.

FIG. 4 illustrates an example method of mode or protocol (NVMe or NVMe-oF) selection for a SSD device. The SSD device may be the SSD device 200 of FIG. 2A.

In method 400, the device (e.g., the SSD device 200) resets at 401.

At 402, the SSD controller (e.g., FPGA 201) of the SSD device (e.g., SSD device 200) checks the status of the RFU pin (e.g., RFU pin 224) of the SFF-TA-1008 connector (e.g., SFF-TA-1008 connector 206) connected at the front end of the SSD device (e.g., SSD device 200).

If at 402, the status of the RFU pin (e.g. RFU pin 224) is determined to be high, at 404, the SSD (e.g., SSD 202) connected to the SSD controller (e.g., the FPGA 201), starts to operate in the NVMe-oF mode.

Once the SSD (e.g., SSD 202) starts to operate in the NVMe-oF mode at 404, at 406, the SSD controller (e.g., FPGA 201) of the SSD device (e.g., SSD device 200) checks the status of the dual port pin of the host device connected to the SSD device (e.g., SSD device 200) via the front end SFF-TA-1008 connector (e.g., SFF-TA-1008 connector 206).

If at 406, the status of the dual port pin of the host device connected to the SSD device (e.g., SSD device 200) is determined to be low, at 408, the SSD (e.g., SSD 202) starts to operate in a dual port NVMe-oF mode, and at 410, the SSD controller (e.g., FPGA 201) downloads NVMe-oF image or microcode for dual port mode to the SSD (e.g., SSD 202) operating in the dual port NVMe-oF mode, from the host device connected to the SSD device (e.g., SSD device 200), via the front end SFF-TA-1008 connector (e.g., SFF-TA-1008 connector 206).

However, if at 406, the status of the dual port pin of the host device connected to the SSD device (e.g., SSD device 200) is determined to be high, at 412, the SSD (e.g., SSD 202) starts to operate in a single port NVMe-oF mode, and at 414, the SSD controller (e.g., FPGA 201) downloads NVMe-oF image or microcode for single port mode to the SSD (e.g., SSD 202) operating in the single port NVMe-oF mode, from the host device connected to the SSD device (e.g., SSD device 200), via the front end SFF-TA-1008 connector (e.g., SFF-TA-1008 connector 206).

If at 402, the status of the RFU pin (e.g. RFU pin 224) is determined to be low, at 416, the SSD (e.g., SSD 202) connected to the SSD controller (e.g., the FPGA 201), starts to operate in the NVMe mode.

Once the SSD (e.g., SSD 202) starts to operate in the NVMe mode at 416, at 418, the SSD controller (e.g., FPGA 201) of the SSD device (e.g., SSD device 200) checks the status of the dual port pin of the host device connected to the SSD device (e.g., SSD device 200) via the front end SFF-TA-1008 connector (e.g., SFF-TA-1008 connector 206).

If at 418, the status of the dual port pin of the host device connected to the SSD device (e.g., SSD device 200) is determined to be low, at 420, the SSD (e.g., SSD 202) starts to operate in a dual port NVMe mode, and at 422, the SSD controller (e.g., FPGA 201) downloads NVMe image or microcode for dual port mode to the SSD (e.g., SSD 202) operating in the dual port NVMe-oF mode, from the host device connected to the SSD device (e.g., SSD device 200), via the front end SFF-TA-1008 connector (e.g., SFF-TA-1008 connector 206).

However, if at 418, the status of the dual port pin of the host device connected to the SSD device (e.g., SSD device 200) is determined to be high, at 424, the SSD (e.g., SSD 202) starts to operate in a single port NVMe mode, and at 426, the SSD controller (e.g., FPGA 201) downloads NVMe image or microcode for single port mode to the SSD (e.g., SSD 202) operating in the single port NVMe mode, from the host device connected to the SSD device (e.g., SSD device 200), via the front end SFF-TA-1008 connector (e.g., SFF-TA-1008 connector 206).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Although exemplary embodiments of a SFF-TA-100X based multi-mode protocols solid state devices have been specifically described and illustrated herein, many modifications and variations will be apparent to those skilled in the art. Accordingly, it is to be understood that to a SFF-TA-100X based multi-mode protocols solid state devices constructed according to principles of this disclosure may be embodied other than as specifically described herein. The inventive concept is also defined in the following claims, and equivalents thereof.

What is claimed is:

1. A storage device comprising:
a solid state drive (SSD);
a field programmable gate array (FPGA) connected to the SSD,
wherein the FPGA is configured to connect to an external host device via a first interface, and
wherein the SSD is configured to:
operate in a non-volatile memory express (NVMe) mode based on a first status of a signal received at the first interface from the external host device; and
operate in a NVMe over fabrics (NVMe-oF) mode based on a second status of the signal received at the first interface from the external host device.

2. The storage device of claim 1, wherein the SSD is one of a new form factor 1 (NF1) SSD, an Ethernet SSD (eSSD), or an embedded SSD; and
wherein the FPGA is a component of the SSD and is configured to operate as a controller of the SSD, the FPGA being connected to the SSD via a second interface.

3. The storage device of claim 1, wherein the second interface is a peripheral component interconnect express (PCIe) interface or a U.2 connector, and the first interface is a small form factor (SFF)-technology affiliate (TA)-100X connector, where X is one of 2, 6, 7, 8, or 9, wherein the SSD has one of SFF-8201 2.5" drive form factor dimensions; SFF-8223 2.5" drive form factor with a serial connector; SFF-8301 3.5" drive form factor dimensions; or SFF-8323 3.5" drive form factor with the serial connector.

4. The storage device of claim 1, wherein the signal from the external host device is received at a pin of the first interface, wherein the pin of the first interface is a reserved for future use (RFU) pin, wherein the first interface is a small form factor (SFF)-technology affiliate (TA)-1008 connector, and wherein the status of the signal at the first interface is the status of the signal at the RFU pin of the SFF-TA-1008 connector.

5. The storage device of claim 4, wherein the SSD operates in the NVMe mode based on determining that the status of the signal at the RFU pin of the SFF-TA-1008 connector is high and the SSD operates in the NVMe-oF mode based on determining that the status of the signal at the RFU pin of the SFF-TA-1008 connector is low, wherein in each of the NVMe mode and the NVMe-oF mode, the SFF-TA-1008 connector operates in X4 single port mode, X4 dual port mode, X8 single port mode, X8 dual port mode, X16 single port mode, and X16 dual port mode.

6. The storage device of claim 5, wherein peripheral component interconnect express (PCIe) signals PERp2, PERn2, PETp2, and PETn2, of the SFF-TA-1008 connector, operate as control host A and Ethernet port 0, and PCIe signals PERp3, PERn3, PETp3, and PETn3, of the SFF-TA-1008 connector, operate as control host A and Ethernet port 1, based on the SSD determining that the SSD and the SFF-TA-1008 connector operate in the NVMe-oF mode and X4 single port mode, respectively.

7. The storage device of claim 5, wherein peripheral component interconnect express (PCIe) signals PERp1, PERn1, PETp1, and PETn1, of the SFF-TA-1008 connector, operate as host A and Ethernet port 0, and PCIe signals PERp3, PERn3, PETp3, and PETn3, of the SFF-TA-1008 connector, operate as host B and Ethernet port 1, based on the SSD determining that the SSD and the SFF-TA-1008 connector operate in the NVMe-oF mode and the X4 dual port mode, respectively.

8. The storage device of claim 5, wherein peripheral component interconnect express (PCIe) signals PERp4, PERn4, PETp4, and PETn4, of the SFF-TA-1008 connector, operate as host A and Ethernet port 0, PCIe signals PERp5, PERn5, PETp5, and PETn5 of the SFF-TA-1008 connector operate as host A and Ethernet port 1, PCIe signals PERp6, PERn6, PETp6, and PETn6, of the SFF-TA-1008 connector, operate as host A and Ethernet port 2, and PCIe signals PERp7, PERn7, PETp7, and PETn7, of the SFF-TA-1008 connector, operate as host A and Ethernet port 3, based on the SSD determining that the SSD and the SFF-TA-1008 connector operate in the NVMe-oF mode and the X8 single port mode, respectively.

9. The storage device of claim 5, wherein peripheral component interconnect express (PCIe) signals PERp2, PERn2, PETp2, and PETn2, of the SFF-TA-1008 connector, operate as host A and Ethernet port 0, PCIe signals PERp3, PERn3, PETp3, and PETn3, of the SFF-TA-1008 connector, operate as host A and Ethernet port 1, PCIe signals PERp6, PERn6, PETp6, and PETn6, of the SFF-TA-1008 connector, operate as host B and Ethernet port 2, and PCIe signals PERp7, PERn7, PETp7, and PETn7, of the SFF-TA-1008 connector, operate as host B and Ethernet port 3, based on the SSD determining that the SSD and the SFF-TA-1008 connector operate in the NVMe-oF mode and the X8 single port mode, respectively.

10. The storage device of claim 5, wherein peripheral component interconnect express (PCIe) signals PERp8, PERn8, PETp8, and PETn8, of the SFF-TA-1008 connector operate as host A and Ethernet port 0, PCIe signals PERp9, PERn9, PETp9, and PETn9 of the SFF-TA-1008 connector operate as host A and Ethernet port 1, PCIe signals PERp10, PERn10, PETp10, and PETn10, of the SFF-TA-1008 connector, operate as host A and Ethernet port 2, PCIe signals PERp11, PERn11, PETp11, and PETn11 of the SFF-TA-1008 connector operate as host A and Ethernet port 3, PCIe signals PERp12, PERn12, PETp12, and PETn12 of the SFF-TA-1008 connector operate as host A and Ethernet port 4, PCIe signals PERp13, PERn13, PETp13, and PETn13 of the SFF-TA-1008 connector operate as host A and Ethernet port 5, PCIe signals PERp14, PERn14, PETp14, and PETn14 of the SFF-TA-1008 connector operate as host A and Ethernet port 6, and PCIe signals PERp15, PERn15, PETp15, and PETn15 of the SFF-TA-1008 connector operate as host A and Ethernet port 7, based on the SSD determining that the SSD and the SFF-TA-1008 connector operate in the NVMe-oF mode and the X16 single port mode, respectively.

11. The storage device of claim 5, wherein peripheral component interconnect express (PCIe) signals PERp8, PERn8, PETp8, and PETn8, of the SFF-TA-1008 connector, operate as host A and Ethernet port 0, PCIe signals PERp9, PERn9, PETp9, and PETn9, of the SFF-TA-1008 connector, operate as host A and Ethernet port 1, PCIe signals PERp10, PERn10, PETp10, and PETn10, of the SFF-TA-1008 connector, operate as host B and Ethernet port 0, PCIe signals PERp11, PERn11, PETp11, and PETn11, of the SFF-TA-1008 connector, operate as host B and Ethernet port 1, PCIe signals PERp12, PERn12, PETp12, and PETn12, of the SFF-TA-1008 connector, operate as host A and Ethernet port 2, PCIe signals PERp13, PERn13, PETp13, and PETn13, of the SFF-TA-1008 connector, operate as host A and Ethernet port 3, PCIe signals PERp14, PERn14, PETp14, and PETn14, of the SFF-TA-1008 connector, operate as host B and Ethernet port 2, and the PCIe signals PERp15, PERn15, PETp15, and PETn15, of the SFF-TA-1008 connector, operate as host B and Ethernet port 3, based on the SSD determining that the SSD and the SFF-TA-1008 connector operate in the NVMe-oF mode and the X16 dual port mode, respectively.

12. A system comprising:
a host device; and
a storage device connected to the host device, the storage device comprising:
a solid state drive (SSD);
a computing device connected to the SSD,
wherein the computing device is configured to connect to the host device via a first interface, and wherein the SSD is configured to:
operate in a non-volatile memory express (NVMe) mode or an NVMe over fabrics (NVMe-oF) mode based on a first status of a signal received at the first interface from the host device; and
operate in a NVMe over fabrics (NVMe-oF) mode based on a second status of the signal received at the first interface from the host device.

13. The system of claim 12, wherein:
the SSD is one of a new form factor 1 (NF1) SSD, an Ethernet SSD (eSSD), or an embedded SSD, and the computing device is a field programmable gate array (FPGA) or an application specific integrated circuit (ASIC);
the FPGA is connected to the SSD via a second interface
the second interface is a peripheral component interconnect express (PCIe) interface or a U.2 connector, and the first interface is a small form factor (SFF)-technology affiliate (TA)-1008 connector;
the signal from the host device is received at a pin of the first interface, the pin of the first interface being a reserved for future use (RFU) pin,
the SSD operates in the NVMe mode or the NVMe-oF mode, based on the status of the signal at the RFU pin of the SFF-TA-1008 connector based on instructions received from the host device via a general purpose input output (GPIO) connecting to the RFU, and
the SSD operates in the NVMe mode based on determining that the status of the signal at the RFU pin of the SFF-TA-1008 connector is high and the SSD operates in the NVMe-oF mode based on determining that the status of the signal at the RFU pin of the SFF-TA-1008 connector is low, wherein in each of the NVMe mode and the NVMe-oF mode, the SFF-TA-1008 connector operates in X4 single port mode, X4 dual port mode, X8 single port mode, X8 dual port mode, X16 single port mode, and X16 dual port mode.

14. The system of claim 13, wherein in the X4 single port mode, based on the SSD determining that the RFU pin of the SFF-TA-1008 connector transitions from low to high status, PCIe signals PERp2, PERn2, PETp2, and PETn2, of the SFF-TA-1008 connector, transition from host A, PCIe lane 2 to host A, Ethernet port 0, and PCIe signals PERp3, PERn3, PETp3, and PETn3, of the SFF-TA-1008 connector, transition from host A, PCIe lane 3 to host A, Ethernet port 1, and wherein in the X4 dual port mode, based on the SSD determining that the RFU pin of the SFF-TA-1008 connector transitions from low to high status, PCIe signals PERp1, PERn1, PETp1, and PETn1, of the SFF-TA-1008 connector, transition from A, PCIe lane 1 to host A, Ethernet port 0, and PCIe signals PERp3, PERn3, PETp3, and PETn3, of the SFF-TA-1008 connector, transition from being configured as host B, PCIe lane 1 to host B, Ethernet port 1.

15. The system of claim 13, wherein in the X8 single port mode, based on the SSD determining that the RFU pin of the SFF-TA-1008 connector transitions from low to high status, PCIe signals PERp4, PERn4, PETp4, and PETn4, of the SFF-TA-1008 connector, transition from host A, PCIe lane 4 to host A, Ethernet port 0, PCIe signals PERp5, PERn5, PETp5, and PETn5, of the SFF-TA-1008 connector, transition from host A, PCIe lane 5 to host A, Ethernet port 1, PCIe signals PERp6, PERn6, PETp6, and PETn6, of the SFF-TA-1008 connector, transition from host A, PCIe lane 6 to host A, Ethernet port 2, and PCIe signals PERp7, PERn7, PETp7, and PETn7, of the SFF-TA-1008 connector, transition from host A, PCIe lane 7 to host A, Ethernet port 3, and wherein in the X8 dual port mode, based on the SSD determining that the RFU pin of the SFF-TA-1008 connector transitions from low to high status, PCIe signals PERp2, PERn2, PETp2, and PETn2, of the SFF-TA-1008 connector, transition from host B, PCIe lane 0 to host A, Ethernet port 0, PCIe signals PERp3, PERn3, PETp3, and PETn3, of the SFF-TA-1008 connector, transition from host B, PCIe lane 1 to host A, Ethernet port 1, PCIe signals PERp6, PERn6, PETp6, and PETn6, of the SFF-TA-1008 connector, transition from host B, PCIe lane 2 to host B, Ethernet port 2, and PCIe signals PERp7, PERn7, PETp7, and PETn7, of the SFF-TA-1008 connector, transition from host B, lane 3 to host B, Ethernet port 3.

16. The system of claim 13, wherein in the X16 single port mode, based on the SSD determining that the RFU pin of the SFF-TA-1008 connector transitions from low to high status, PCIe signals PERp8, PERn8, PETp8, and PETn8, of the SFF-TA-1008 connector, transition from host A, PCIe lane 8 to host A, Ethernet port 0, PCIe signals PERp9, PERn9, PETp9, and PETn9, of the SFF-TA-1008 connector, transition from host A, PCIe lane 9 to host A, Ethernet port 1, PCIe signals PERp10, PERn10, PETp10, and PETn10, of the SFF-TA-1008 connector, transition from host A, PCIe lane 10 to host A, Ethernet port 2, PCIe signals PERp11, PERn11, PETp11, and PETn11, of the SFF-TA-1008 connector, transition from host A, PCIe lane 11 to host A, Ethernet port 3, PCIe signals PERp12, PERn12, PETp12, and PETn12, of the SFF-TA-1008 connector, transition from host A, PCIe lane 12 to host A, Ethernet port 4, PCIe signals PERp13, PERn13, PETp13, and PETn13, of the SFF-TA-1008 connector, transition from host A, PCIe lane 13 to host A, Ethernet port 5, PCIe signals PERp14, PERn14, PETp14, and PETn14, of the SFF-TA-1008 connector, transition from host A, lane 14 to host A, Ethernet port 6, and PCIe signals PERp15, PERn15, PETp15, and PETn15, of the SFF-TA-1008 connector, transition from host A, lane 15 to host A, Ethernet port 7.

17. The system of claim 13, wherein in the X16 dual port mode, based on the SSD determining that the RFU pin of the SFF-TA-1008 connector transitions from low to high status, PCIe signals PERp8, PERn8, PETp8, and PETn8, of the SFF-TA-1008 connector, transition from host A, PCIe lane 4 to host A, Ethernet port 0, PCIe signals PERp9, PERn9, PETp9, and PETn9, of the SFF-TA-1008 connector, transition from host A, PCIe lane 5 to host A and Ethernet port 1, PCIe signals PERp10, PERn10, PETp10, and PETn10, of the SFF-TA-1008 connector, transition from host B, PCIe lane 4 to host B, Ethernet port 0, PCIe signals PERp11, PERn11, PETp11, and PETn11, of the SFF-TA-1008 connector, transition from host B, PCIe lane 5 to host B, Ethernet port 1, PCIe signals PERp12, PERn12, PETp12, and PETn12, of the SFF-TA-1008 connector, transition from host A, PCIe lane 6 to host A, Ethernet port 2, PCIe signals PERp13, PERn13, PETp13, and PETn13, of the SFF-TA-1008 connector, transition from host A, PCIe lane 7 to host A, Ethernet port 3, PCIe signals PERp14, PERn14, PETp14, and PETn14, of the SFF-TA-1008 connector, transition from host B, PCIe lane 6 to host B, Ethernet port 2, and PCIe signals PERp15, PERn15, PETp15, and PETn15, of the SFF-TA-1008 connector, transition from host B, PCIe lane 7 to host B, Ethernet port 3.

18. A method of selecting operating mode for a storage device, the storage device comprising a solid state drive (SSD) and a field programmable gate array (FPGA) is configured to connect to a host device via a first interface, the method comprising:
    determining a status of a signal received at the first interface from the host device;
    determining an operating mode of the storage device from among a non-volatile memory express (NVMe) mode and a NVMe over fabrics (NVMe-oF) mode based on the status of the signal received at the first interface from the host device; and
    determining a status of a signal at the host device to determine if the storage device is operating in a single port mode or a dual port mode.

19. The method of claim 18, wherein:
    the SSD is one of a new form factor 1 (NF1) SSD, an Ethernet SSD (eSSD), or an embedded SSD, and the FPGA is configured to operate as a controller of the SSD and is connected to the SSD via a second interface;
    the second interface is a peripheral component interconnect express (PCIe) interface or a U.2 connector, and the first interface is a small form factor (SFF)-technology affiliate (TA)-1008 connector;
    the signal from the host device is received at a pin of the first interface, the pin of the first interface being a reserved for future use (RFU) pin;
    the status of the signal at the first interface is the status of the signal at the RFU pin of the SFF-TA-1008 connector;
    the storage device operates in the NVMe mode based on determining that the status of the signal at the RFU pin of the SFF-TA-1008 connector is high and the storage device operates in the NVMe-oF mode based on determining that the status of the signal at the RFU pin of the SFF-TA-1008 connector is low; and
    the storage device operates in the dual port mode based on determining that a status of a dual port pin in the host device is low and the storage device operates in the single port mode based on determining that the status of the dual port pin in the host device is high.

20. The method of claim 19, further comprising:
    downloading a first NVMe-oF image or a first microcode for the dual port mode to the storage device, based on the storage device determining that the storage device is operating in the dual port mode and the NVMe-oF mode,
    downloading a second NVMe-oF image or a second microcode for the single port mode to the storage device, based on the storage device determining that the storage device is operating in the single port mode and the NVMe-oF mode,
    downloading a third NVMe image or a third microcode for the dual port mode to the storage device, based on the storage device determining that the storage device is operating in the dual port mode and the NVMe mode, and
    downloading a fourth NVMe image or a fourth microcode for the single port mode to the storage device, based on the storage device determining that the storage device is operating in the single port mode and the NVMe mode.

* * * * *